US008625347B2

(12) United States Patent
Sakurada

(10) Patent No.: US 8,625,347 B2
(45) Date of Patent: Jan. 7, 2014

(54) MEMORY DEVICE AND CONTROL METHOD OF MEMORY DEVICE

(75) Inventor: Kenji Sakurada, Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/597,444

(22) Filed: Aug. 29, 2012

(65) Prior Publication Data
US 2013/0077400 A1 Mar. 28, 2013

(30) Foreign Application Priority Data

Sep. 22, 2011 (JP) ................................. 2011-207701

(51) Int. Cl.
G11C 11/34 (2006.01)
(52) U.S. Cl.
USPC .................................................. 365/185.03
(58) Field of Classification Search
USPC .................................................. 365/185.03
See application file for complete search history.

(56) References Cited

U.S. PATENT DOCUMENTS 7,814,401 B2 * 10/2010 Alrod et al. .................... 714/794
8,023,532 B2 9/2011 Rainish
8,037,394 B2 10/2011 Djurdjevic et al.
8,250,437 B2 * 8/2012 Sakurada et al. ............. 714/764
2008/0285351 A1 11/2008 Shlick et al.
2010/0223538 A1 * 9/2010 Sakurada ...................... 714/801
2012/0224420 A1 * 9/2012 Sakurada et al. ........ 365/185.03
2012/0297273 A1 * 11/2012 Sakaue et al. ................. 714/773
2013/0176778 A1 * 7/2013 Chen et al. ............... 365/185.03

FOREIGN PATENT DOCUMENTS

JP 2009-26436 2/2009
JP 2011-100519 5/2011

OTHER PUBLICATIONS

U.S. Appl. No. 13/544,147, filed Jul. 9, 2012, Kurosawa.

* cited by examiner

Primary Examiner — Hoai V Ho
Assistant Examiner — Pablo Huerta
(74) Attorney, Agent, or Firm — Oblon, Spivak, McClelland, Maier & Neustadt, L.L.P.

(57) ABSTRACT

A memory card includes: a plurality of memory cells; a CPU core; and an ECC unit configured to perform soft decision decoding. If decoding based on an LLR acquired from a first LLR table fails, the memory card measures a threshold voltage distribution centered on a first HB read voltage with a highest voltage. If a first shift value as a difference between a least frequent voltage of the threshold voltage distribution and the first HB read voltage is "negative", the memory card performs decoding based on an LLR acquired from the second LLR table. If the first shift value is "positive", the memory card performs decoding based on an LLR acquired from a third LLR table.

20 Claims, 15 Drawing Sheets

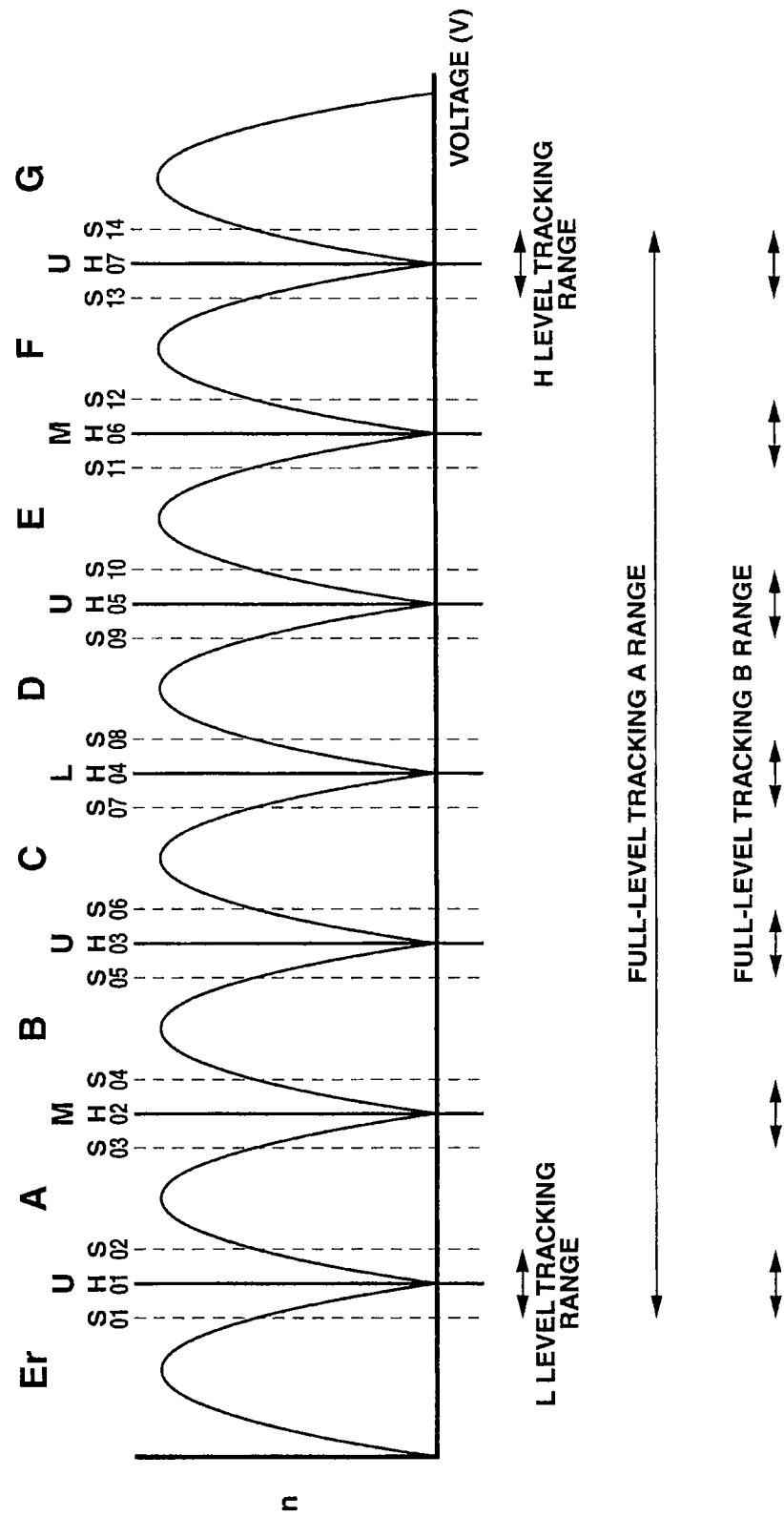

MEMORY DEVICE AND CONTROL METHOD OF MEMORY DEVICE

CROSS-REFERENCE TO RELATED APPLICATIONS

This application claims the benefit of Japanese Application No. 2011-207701 filed in Japan on Sep. 22, 2011 and Japanese Application No. 2012-076747 filed in Japan on Mar. 29, 2012, the contents of which are incorporated herein by this reference.

FIELD

Embodiments described herein relate generally to a memory device including a plurality of memory cells, each storing data of a plurality of bits, and a control method of the memory device.

BACKGROUND

In manufacturing of a memory cell of a memory device, two N-type semiconductor sections serving as a source and a drain are formed to sandwich a P-type semiconductor layer on a silicon substrate. A polysilicon floating gate placed between oxide layers is formed over the P-type semiconductor layer, and a control gate is further formed over the floating gate. Therefore, an electric charge (electrons) accumulated on the floating gate of the memory cell is held by the oxide layers that cover the floating gate, and data can be held for a long time without supply of a power source.

Writing of data to the memory cell is performed by injecting electrons to the floating gate by a quantum tunneling effect through the oxide layers. The n-type semiconductors as circuit substrates are set as a ground potential, and a write voltage is applied to the control gate by a tiny amount of electric current. The electrons accumulated in the floating gate store information. In a multivalued memory, information of a plurality of bits is stored based on an amount of electric charge accumulated on the floating gate.

In reading of information of data from the memory cell, a read voltage is applied between the source and the drain. A gate voltage that starts a flow of a current between the source and the drain, i.e. a threshold voltage varies depending on the number of electrons (amount of electric charge) in the floating gate. A plurality of predetermined read voltages are sequentially applied to the gate of the memory cell to check whether the threshold voltage corresponding to the information stored in the memory cell exceeds the read voltages.

In the flash memory cell, electrons penetrate through an oxide film as an insulator in each writing or reading. Therefore, an increase in the number of writings and the number of readings degrades the oxide film.

In recent years, a size of the memory cell is reduced due to increased memory density of the memory device, and the amount of electric charge accumulated on the floating gate is reduced. Therefore, influence of interference noise between adjacent cells is relatively increasing. More specifically, writing (program) or reading of data to and from the memory cell may change data of an adjacent memory cell.

For example, data is written to a memory cell selected by a word line and a bit line. However, non-selected cells also enter a weak writing state, and a program disturb (hereinafter, called "PD") phenomenon occurs, in which the threshold voltage increases. The non-selected memory cells also enter the weak writing state in the reading of data, and a read disturb (hereinafter, called "RD") phenomenon occurs, in which the threshold voltage increases.

On the other hand, when the data written to the memory cell is not accessed for a long time, the electrons are gradually discharged from the floating gate of the memory cell, and a data retention (hereinafter, called "DR") phenomenon occurs, in which the threshold voltage is reduced.

To prevent an occurrence of a data read error caused by the RD, DR, or the like to improve reliability of the memory device, for example, changing a read level (voltage) is effective.

BRIEF DESCRIPTION OF THE DRAWINGS

FIG. 16 is an explanatory view for explaining full-level tracking.

DETAILED DESCRIPTION

Figure 1:
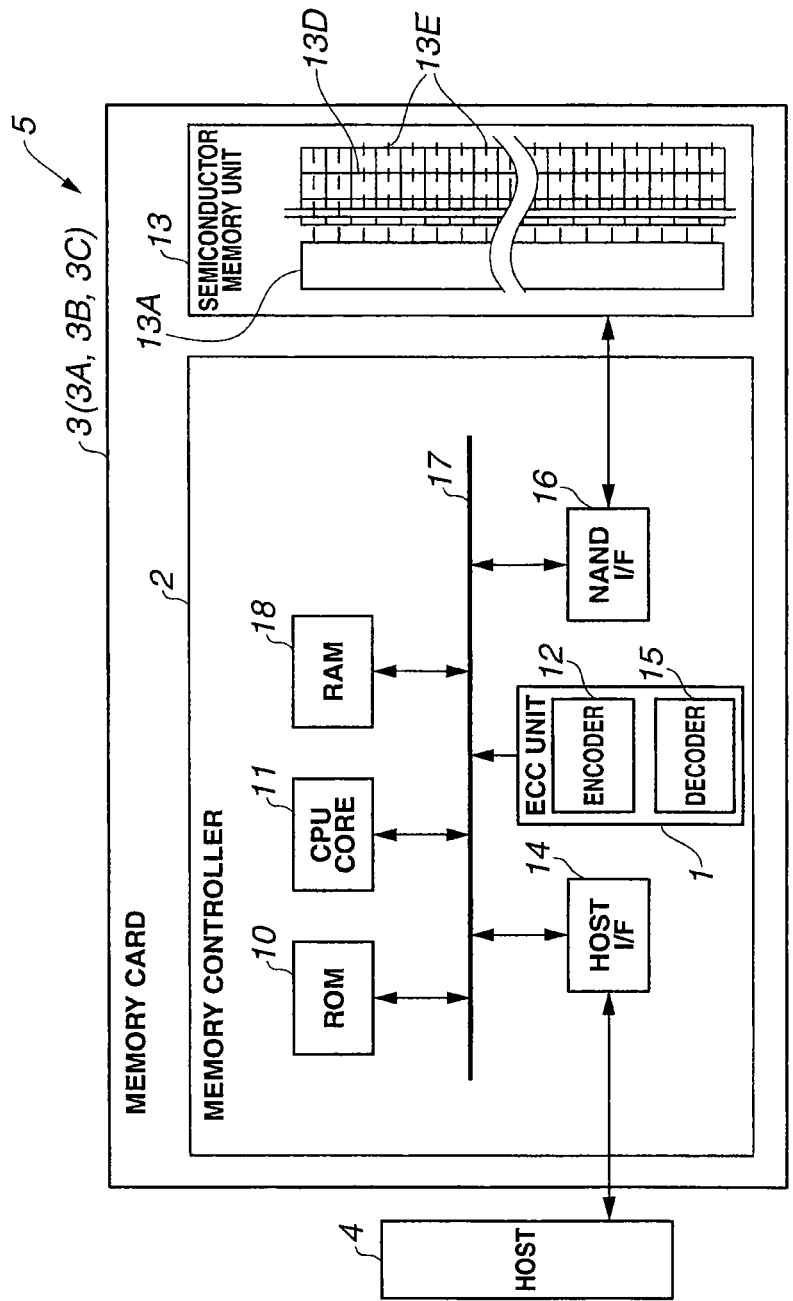
FIG. 1 is a configuration diagram showing a schematic configuration of a memory card of a first embodiment.

An aspect of the present invention provides a memory device including: a plurality of memory cells, each memory cell storing data of N bits (N is a natural number no less than 2); a control unit configured to perform control of applying voltages of a read voltage set including ($2^N-1$) hard bit read voltages and a plurality of soft bit read voltages to each of the memory cells; and an error correction unit configured to acquire a log likelihood ratio from a log likelihood ratio table on the basis of soft bit data read out by the soft bit read voltages, the error correction unit configured to perform soft decision decoding based on the acquired log likelihood ratio, wherein the control unit performs first tracking for measuring a first threshold voltage distribution of a first tracking range, which is centered on a first hard bit read voltage with a highest voltage among the plurality of hard bit read voltages and which is no greater than $1/(2^N-1)$ of a difference between a second hard bit read voltage with a lowest voltage among the plurality of hard bit read voltages and the first hard bit read voltage, at voltage intervals that are no less than $\frac{1}{100}$ and no greater than $\frac{1}{4}$ of intervals of the hard bit read voltages, and the error correction unit performs the soft decision decoding based on log likelihood ratios acquired from different log likelihood ratio table based on a histogram of the first threshold voltage distribution and according to a positive or negative sign of a first shift value based on a difference between a first least frequent voltage acquired from an approximation curve or a moving average and the first hard bit read voltage.

Another aspect of the present invention provides a method of controlling a memory device, the memory device including: a plurality of memory cells, each memory cell storing data of N bits (N is a natural number no less than 2); a control unit configured to perform control of applying voltages of a read voltage set including ($2^N-1$) hard bit read voltages for reading a hard bit data and a plurality of soft bit read voltages for reading a threshold voltage including degree-of-reliability information of the hard bit data to each of the memory cells; and an error correction unit configured to perform soft decision decoding based on a log likelihood ratio acquired from a log likelihood ratio table on the basis of the threshold voltage, the method including: measuring a first threshold voltage distribution of a predetermined range centered on a first hard bit read voltage with a highest voltage among the plurality of hard bit read voltages; calculating a first shift value based on a difference between a first least frequent voltage acquired from the first threshold voltage distribution and the first hard bit read voltage; performing, if the first shift value is negative, control of applying a second soft bit read voltage that is set on a low voltage side of each of the hard bit read voltages to the memory cells, and performing, if the first shift value is positive, control of applying a third soft bit read voltage that is set on a high voltage side of each of the hard bit read voltages to the memory cells; and performing the soft decision decoding based on a log likelihood ratio acquired from a second log likelihood ratio table or a third log likelihood ratio table on the basis of a threshold voltage read out by the second soft bit read voltage or the third soft bit read voltage, by the error correction unit.

First Embodiment

As shown in FIG. 1, a memory card 3 as a memory device of the present embodiment is a storage medium configured to store data received from a host 4, such as a personal computer and a digital camera, and to transmit stored data to the host 4.

The memory card 3 and the host 4 may form a memory system 5, such as an MP3 player as a portable music player.

The memory card 3 includes a memory unit 13 and a memory controller 2 provided with a decoder 15. The memory unit 13 includes a NAND flash memory and has a structure, in which a large number of memory cells 13D as unit cells are connected by bit lines (not shown) and word lines 13E. The reading and the writing are performed page by page, each page including a plurality of bit data. Data is deleted block by block, each block including a plurality of pages. The word lines 13E are connected to a word line control unit 13A. The memory cells 13D are multivalued memory cells capable of storing data of N bits (N is a natural number no less than 2) in each memory cell.

The memory controller 2 includes a ROM 10, a CPU core 11, a RAM 18, a host I/F (interface) 14, an error correction unit (hereinafter, called "ECC unit") 1, and a NAND I/F (interface) 16 that are connected through a bus 17.

The memory controller 2 uses the CPU core 11 as a control unit to transmit and receive data to and from the host 4 through the host I/F 14, to transmit and receive data to and from the memory unit 13 through the NAND I/F 16, and to perform overall control. The memory controller 2 realizes address management of the memory unit 13 by FW (firmware) executed by the CPU core 11. Control of the entire memory card 3 corresponding to command input from the host 4 is also executed by the FW. The ROM 10 stores a control program and the like of the memory card 3, and the RAM 18 stores an address conversion table and the like necessary in the address management.

The ECC unit 1 includes an encoder 12 configured to generate and provide an error correcting code during data storage and a decoder 15 configured to decode read encoded data during data reading. The encoding and the decoding are performed ECC frame by ECC frame, each ECC frame including a plurality of bit data. Note that a page as a write and read unit includes a plurality of ECC frames. The ECC unit 1 of the decoder 15 of the present embodiment uses an LDPC code as an error correction code for soft decision decoding by iterative calculation based on probability, in addition to a sign for hard decision decoding.

Note that, the memory card 3 includes the word line control unit 13A configured to perform control of applying voltages of a predetermined read voltage set described later to the memory cells 13D through the word lines 13E, and the word line control unit 13A also operates under the control of the CPU core 11 configured to control the entire memory card 3. For the simplification of the following description, the CPU core 11 also performs the control performed by the word line control unit 13. The log likelihood ratio tables described later are stored in, for example, the ROM 10.

In the hard decision decoding, a hard bit (HB) indicating whether data is "0" or "1" and parity provided to the ECC frame are used to perform an operation. On the other hand, in the soft decision decoding of data encoded by, for example, the LDPC code, a log likelihood ratio (hereinafter, also called "LLR" and indicated by a sign "X") is acquired based on a log likelihood ratio table (see FIG. 4 or the like) from soft bit (SB) data including degree-of-reliability information (likelihood) of HB data read out by applying a plurality of predetermined soft bit (SB) read voltages. On the basis of the LLR, an error correction process is executed by iterative calculation for each ECC frame based on probability.

As already described, the threshold voltage of the memory cells 13D storing data may be changed by the read disturb (RD), the data retention (DR), or the like.

Figure 2A:
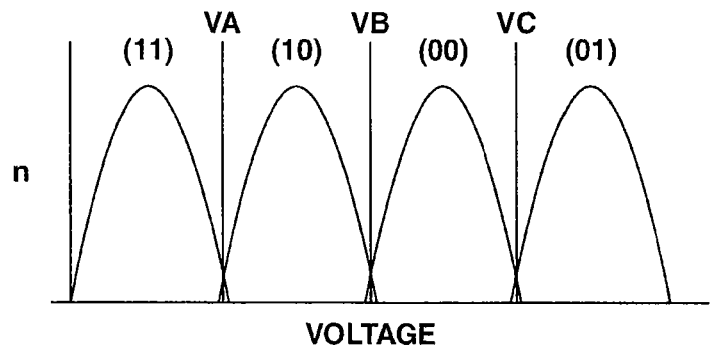
FIG. 2A is an explanatory view for explaining a threshold voltage distribution in an initial state of the memory card of the first embodiment.
Figure 2B:
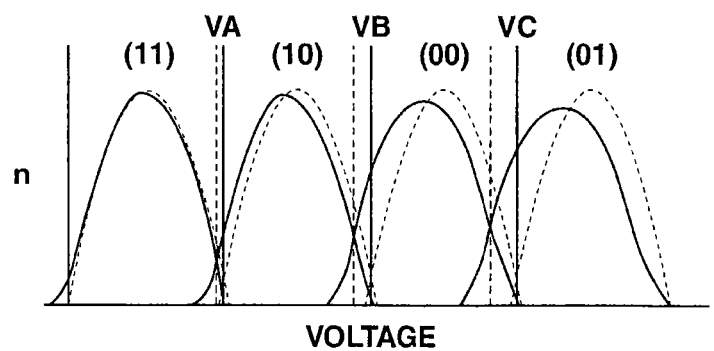
FIG. 2B is an explanatory view for explaining a threshold voltage distribution in a data retention state of the memory card of the first embodiment.
Figure 2C:
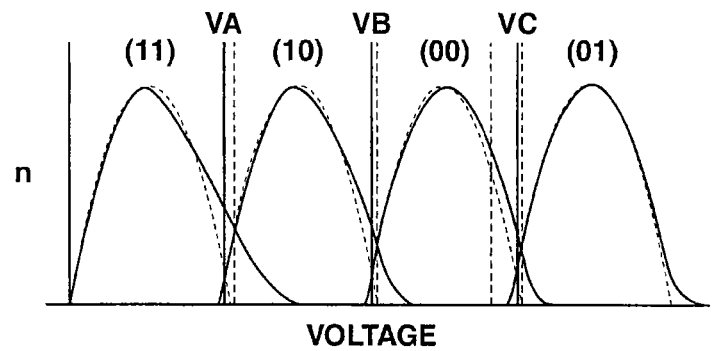
FIG. 2C is an explanatory view for explaining a threshold voltage distribution in a read disturb state of the memory card of the first embodiment.

FIGS. 2A to 2C show distributions of the threshold voltage of the memory cells. A horizontal axis of FIGS. 2A to 2C denotes a threshold voltage V, and a vertical axis denotes the number n of memory cells having the threshold voltage V shown in the horizontal axis. The memory cells shown here are N=2 memory cells. Therefore, four types of data (11), (10), (00), and (01) are stored based on the threshold voltage that can be divided into $2^N(=4)$. As shown in FIG. 2A, an HB read voltage set for reading the data stored in the memory cells includes 3 ($=2^N-1$) voltages of VA, VB, and VC. More specifically, three voltages VA, VB, and VC as least frequent voltages that are voltages with the least number n in the threshold voltage distribution are applied to the memory cells, and a threshold voltage level of the threshold voltage of the memory cells becomes clear. Therefore, HB data can be read out.

Note that information of the HB read voltage set is preset based on design, manufacturing conditions, and the like and is stored in, for example, the ROM 10.

However, as shown in FIG. 2B, if the memory cells are influenced by the DR, a low voltage side of the distribution of the threshold voltage becomes wide as indicated by a solid line, compared to an initial distribution indicated by a dotted line. Therefore, the data may not be able to be correctly read out by the voltages VA, VB, and VC as the read voltage set of initial setting.

Conversely, as shown in FIG. 2C, if the memory cells are affected by the RD, a high voltage side of the distribution of the threshold voltage of the memory cells becomes wide as indicated by a solid line, compared to the initial distribution indicated by a dotted line. Therefore, the data may not be able to be correctly read out by the voltages VA, VB, and VC of the read voltage set of the initial setting.

On the other hand, the memory card 3 measures the threshold voltage distribution and performs control according to a result of the measurement when decoding cannot be performed by normal soft decision decoding.

Hereinafter, the decoding by the memory card 3 will be described with reference to a flow chart of FIG. 3.
<Step S10>

Figure 4:
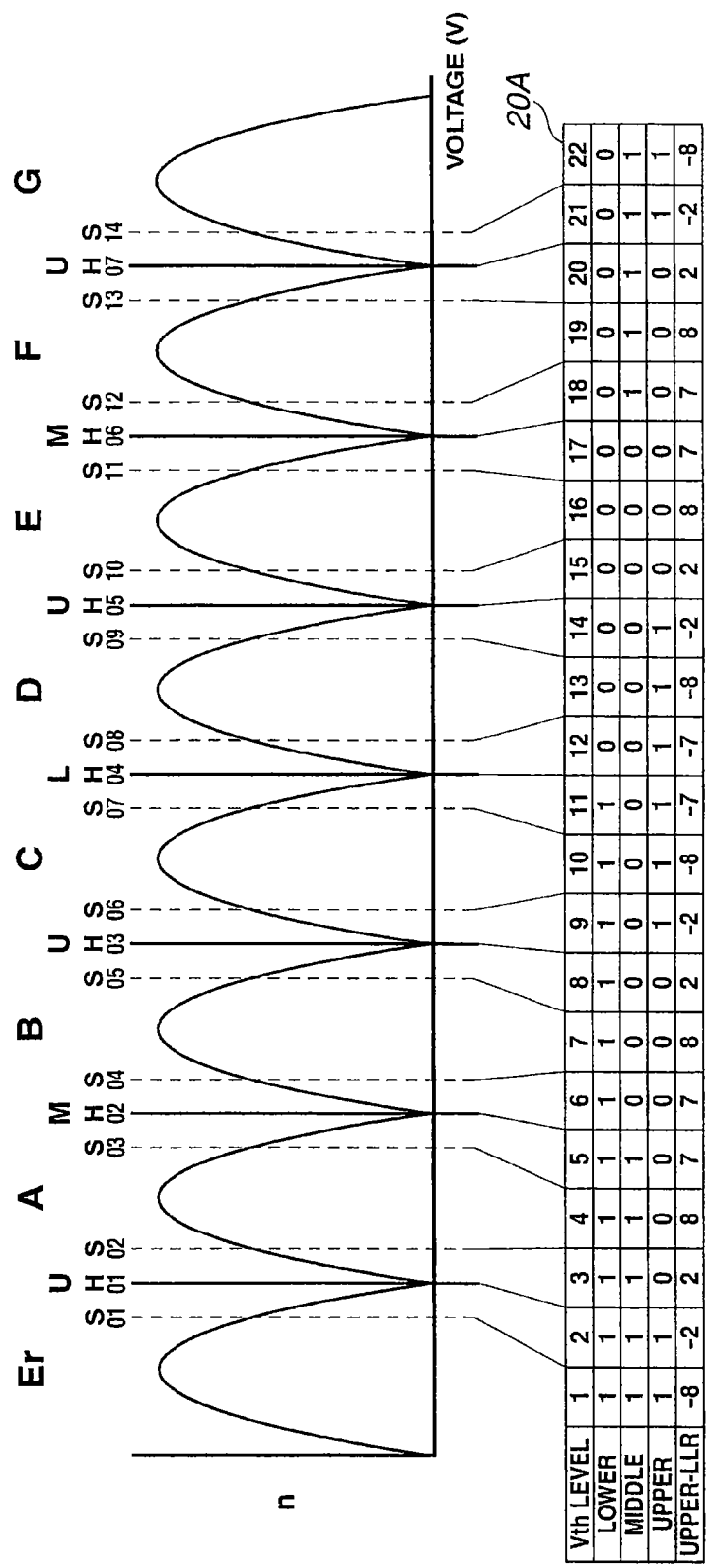
FIG. 4 is a first LLR table in normal decoding of the memory card of the first embodiment.

As shown in FIG. 4, in the following description, each of the memory cells 13D of the memory card 3 is a 3-bit cell (N=3), in which each of a lower bit, a middle bit, and an upper bit stores data of 1 bit. Seven HB read voltages of H01 to H07 are applied to read the HB data from the memory cells 13D. More specifically, the number of HB read voltages for reading the data of the memory cells storing data of N bits (N is a natural number no less than 2) is ($2^N-1$).

For example, as shown in FIG. 4, if a threshold voltage Vth is between H04 and H05 (D level), the HB data stored in the memory cell is determined to be (001). Note that (001) denotes that the lower bit and the middle bit are "0", and the upper bit is "1".
<Steps S10, S11, and S12>

HB data including predetermined ECC frames is used to perform hard decision decoding. If decoding can be performed (S12: Yes), decoded data is transmitted to the host 4 in step S26.
<Steps S13, S14, and S15> (SB1 Decryption)

If the hard decision decoding cannot be performed (S12: No), voltages of a read voltage set including 14 SB read voltages of S01 to S14 for performing soft decision decoding with higher error correction capability are sequentially applied to the memory cells 13D.

Note that the number of SB read voltages is not limited to $2\times(2^N-1)$ including one on the low voltage side and one on the high voltage side of each HB read voltage as shown in FIG. 4, but the number may be, for example, $4\times(2^N-1)$.

The soft bit data (threshold voltage (Vth) level) read out by the SB read voltage includes degree-of-reliability information of hard bits HB. For example, although the HB data (Vth level 10) read out between S06 and S07 is the same (101) as the HB data (Vth level 9) read out between H03 and S06, the reliability of HB data (Vth level 10) is higher.

In the soft decision decoding, an LLR indicating likelihood of the HB data from the soft bit data read out by the SB read voltage is acquired from a first log likelihood ratio table (LLR table) 20A for normal decoding shown in FIG. 4. An absolute value $|\lambda|$ of the log likelihood ratio $\lambda$ is the degree of reliability. The greater the degree of reliability, the higher the reliability. Conversely, the closer the degree of reliability to 0, the lower the reliability. In the LDPC decoding, an error correction process is executed by the soft decision decoding using iterative calculation on the basis of an initial LLR acquired from the LLR table.

More specifically, an iteration process is executed, in which local inference results between a bit node corresponding to each bit of a codeword and a check node corresponding to each parity check equation connected on a Tanner graph are exchanged and updated, in a predetermined number of bit data. If decoding can be performed within a predetermined maximum number of iterations (Yes), the decoded data is transmitted to the host 2 in step S26.
<Step S16>

If error correction cannot be performed by normal soft decision decoding (SB1 decoding) using the first LLR table 20A based on first soft bit data (SB1) of step S14 (S15: No), the RD or the DR may be occurring. Measurement of the threshold voltage distribution is most effective to surely figure out which one of the phenomena is occurring. Hereinafter, the threshold voltage distribution measurement will be called "tracking". However, a long time is required to measure the threshold voltage distribution of the entire range of the read voltages (full-level tracking).

On the other hand, the memory card 3 performs first tracking that is level 1 tracking for measuring only the threshold voltage distribution of part of the voltage range, and the tracking time is short. More specifically, the first tracking is level 1 tracking for measuring only a first threshold voltage distribution of a predetermined range (first tracking range) centered on the hard bit read voltage H07 (first HB read voltage) with a highest voltage among seven hard bit read voltages H01 to H07. Note that the first tracking range needs to include only one of the hard bit read voltages H01 to H07. However, it is preferable that the first tracking range includes the first HB read voltage H07 with the highest voltage, but does not include the other hard bit read voltages H01 to H06.

The tracking range of the first tracking (first tracking range) needs to include only the first HB read voltage H07. However, it is preferable that the first tracking range is centered on the voltage H07 and is appropriately set within a range of a peak voltage of a distribution F and a peak voltage of a distribution G positioned below and above the voltage H07. For example, the range of the peak voltage of the distribution F and the peak voltage of the distribution G is set to no greater than 1/7 of a range of a peak voltage of a distribution Er and the peak voltage of the distribution G that is a full-level tracking range. More specifically, in a memory card for reading hard bit data by ($2^N-1$) hard bit read voltages, the first tracking range in the level 1 tracking is no greater than $1/(2^N-1)$ of the tracking range of the full-level tracking.

Figure 5:
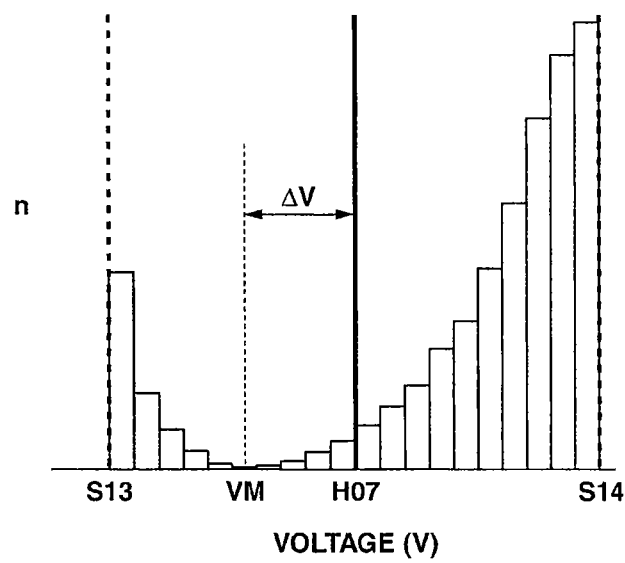
FIG. 5 is an explanatory view for explaining a histogram of the threshold voltage distribution of the memory card of the first embodiment.

As shown in FIG. 5, the first tracking range is a range of SB read voltages S13 to S14 in front and back of the HB read voltage H07. For example, if the range of the SB read voltage S13 to S14 is ½ of the range of the peak voltage of the distribution F and the peak voltage of the distribution G, the first tracking range is no greater than $1/14 (1/(2\times(2^N-1)))$ of the tracking range (S01 to S14) of the full-level tracking.

As shown in FIG. 5, measurement intervals in the first tracking range are obtained by, for example, dividing the tracking range by 20.

It is preferable that the number of divisions of tracking (division intervals) of the first tracking range, i.e. the interval of voltages for measuring the threshold voltage distribution, is 1/100 or more and 1/4 or less of the interval of the HB read voltages (interval of H06 to H07). If the interval is no less than the range, the tracking time is within an allowable range. If the interval is no greater than the range, which one of the phenomena is occurring can be surely figured out. In the example shown in FIG. 5, the interval of the measurement voltage of the threshold voltage distribution is 1/10 of the interval of the HB read voltage, or of a difference AR between the voltages of H06 and H07.

The memory cells to be tracked do not have to be all memory cells belonging to a block, which is a predetermined decoding unit or a predetermined deletion unit, or belonging to a page, which is a read unit. For example, it is preferable that the memory cells to be tracked are 1% or more and 50% or less of the plurality of memory cells forming a block. If the number is no less than the range, which one of the phenomena is occurring can be surely figured out. If the number is no greater than the range, the tracking time is within the allowable range.

Figure 3:
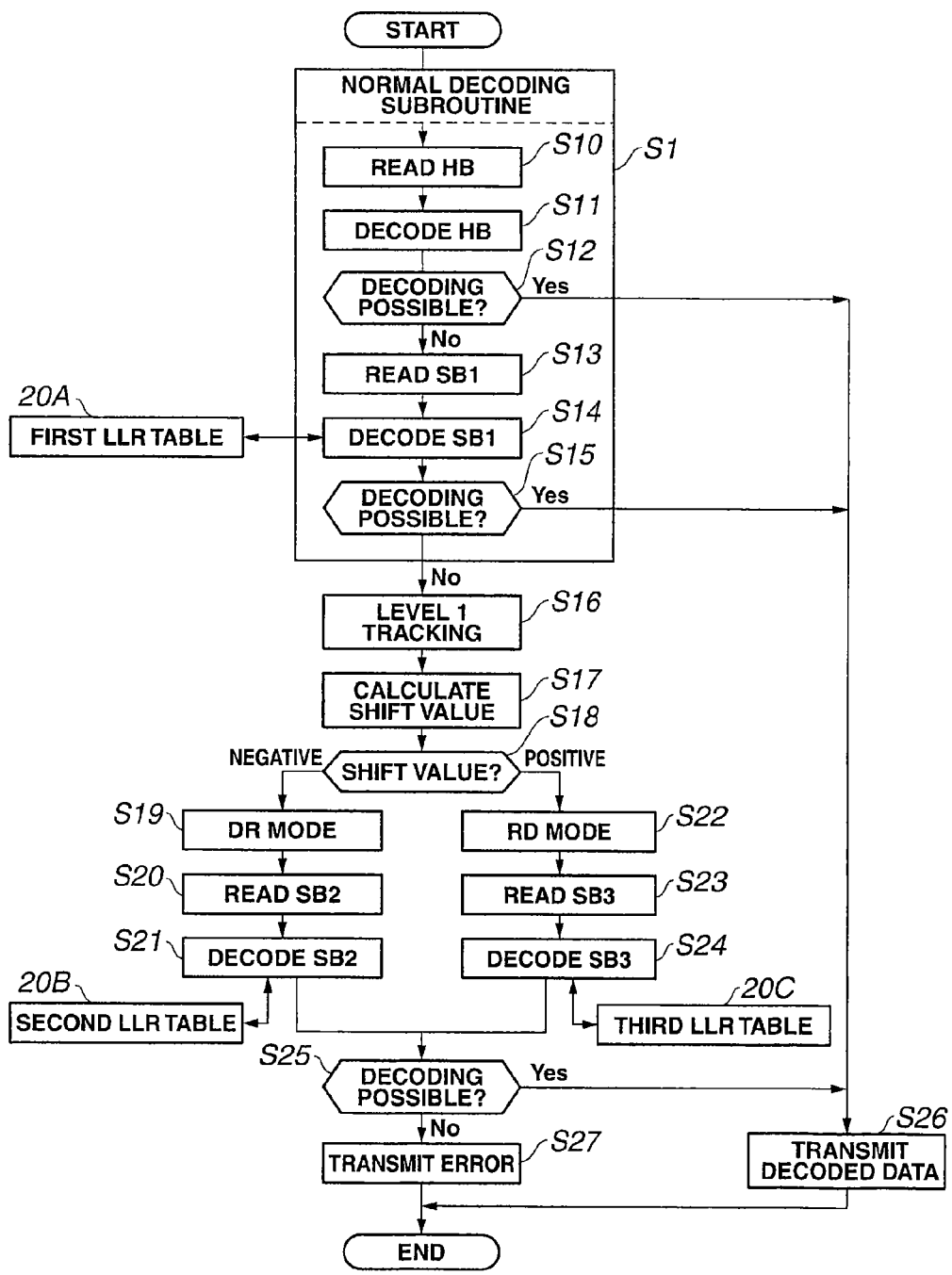
FIG. 3 is a flow chart for explaining a control method of the memory card of the first embodiment.

Although not illustrated in the flow chart of FIG. 3, for example, the number of times N that the normal soft decision decoding cannot be performed block by block is counted in the memory card 3, and the number N is stored in a non-volatile storage unit, such as in part of the memory unit. If the number of errors N exceeds a predetermined threshold K, the control unit may perform the tracking of the block. More specifically, as described later, it is preferable that the CPU core 11 as a control unit controls to perform the first tracking if the number of failures in the soft decision decoding (SB1 decoding) based on the LLR acquired from the first LLR table (see FIG. 4) exceeds the predetermined threshold K.

<Step S17>

A first least frequent voltage VM of the first threshold voltage distribution is acquired from a result of tracking. As shown in FIG. 5, the first least frequent voltage VM is a median value of a voltage level with the smallest n in the histogram of the first threshold voltage distribution. A first shift value ΔV as a difference obtained by subtracting the first hard bit read voltage H07 from the first least frequent voltage VM is acquired. More specifically, the first shift value ΔV is a value based on the difference between the first least frequent voltage VM acquired from the first threshold voltage distribution and the first hard bit read voltage H07.

Figure 6:
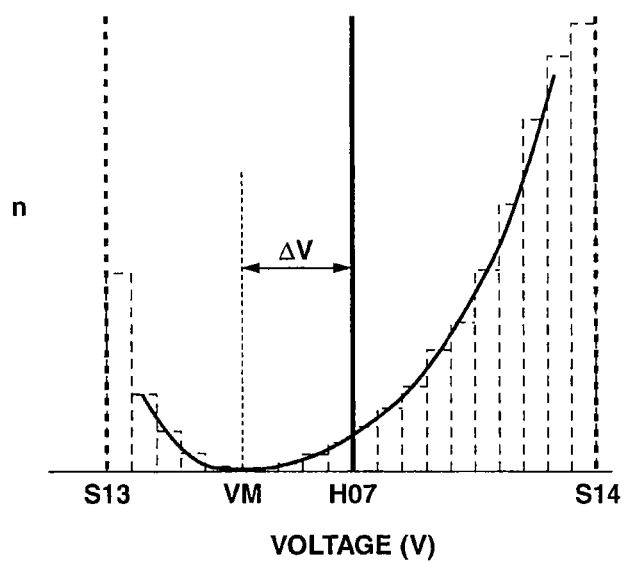
FIG. 6 is an explanatory view for explaining an approximation curve of the threshold voltage distribution of the memory card of the first embodiment.

In the acquisition of the least frequent voltage VM, an approximation curve may be acquired based on the histogram of the threshold voltage distribution acquired by tracking as illustrated in FIG. 6. In place of the approximation curve, a moving average may be acquired based on the histogram. For the moving average, a weighted moving average applied with a weight is more preferable than a simple moving average, and for example, use of a five-point weighted moving average is preferable.

The number of cells near the least frequent voltage VM is small, and a measurement error easily occurs. However, the approximation curve or the like can be used to reduce the influence of the error.

Offset correction can also be applied to the least frequent voltage VM. As described later, a processing mode is changed in the memory card 3 based on a positive or negative sign of the first shift value ΔV that is a difference between the least frequent voltage VM and the first hard bit read voltage H07, i.e. based on whether the first shift value ΔV is "positive" or "negative". However, due to characteristics of the memory cells, the least frequent voltage VM of the threshold voltage distribution near the first HB read voltage H07 with the highest voltage among the seven HB read voltages H01 to H07 easily moves in the low voltage direction, but does not easily move in the high voltage direction. Therefore, it may be preferable to apply offset correction for adding a predetermined offset voltage to the acquired least frequent voltage VM. The offset voltage is preset according to the characteristics of the memory card 3 and is, for example, 1/1000 or more and 1/50 or less of the interval of the SB read voltages.

<Step S18>

The positive or negative sign of the first shift value ΔV is determined.

In the example shown in FIG. 5, the first least frequent voltage VM is smaller than the first hard bit read voltage H07. More specifically, the positive or negative sign of the first shift value ΔV as a difference obtained by subtracting the first hard bit read voltage H07 from the first least frequent voltage VM is a "negative sign (−)". If the first shift value ΔV is "negative" which is smaller than 0, decoding of a data retention mode (DR mode) is performed from step S19.

On the other hand, if the positive or negative sign of the first shift value ΔV is a "positive sign (+)", i.e. if the first shift value ΔV is "positive" which is greater than 0, decoding of a read disturb mode (RD mode) is performed from step S22.

<Steps S19 and S20> (SB2 Decoding)

Figure 7:
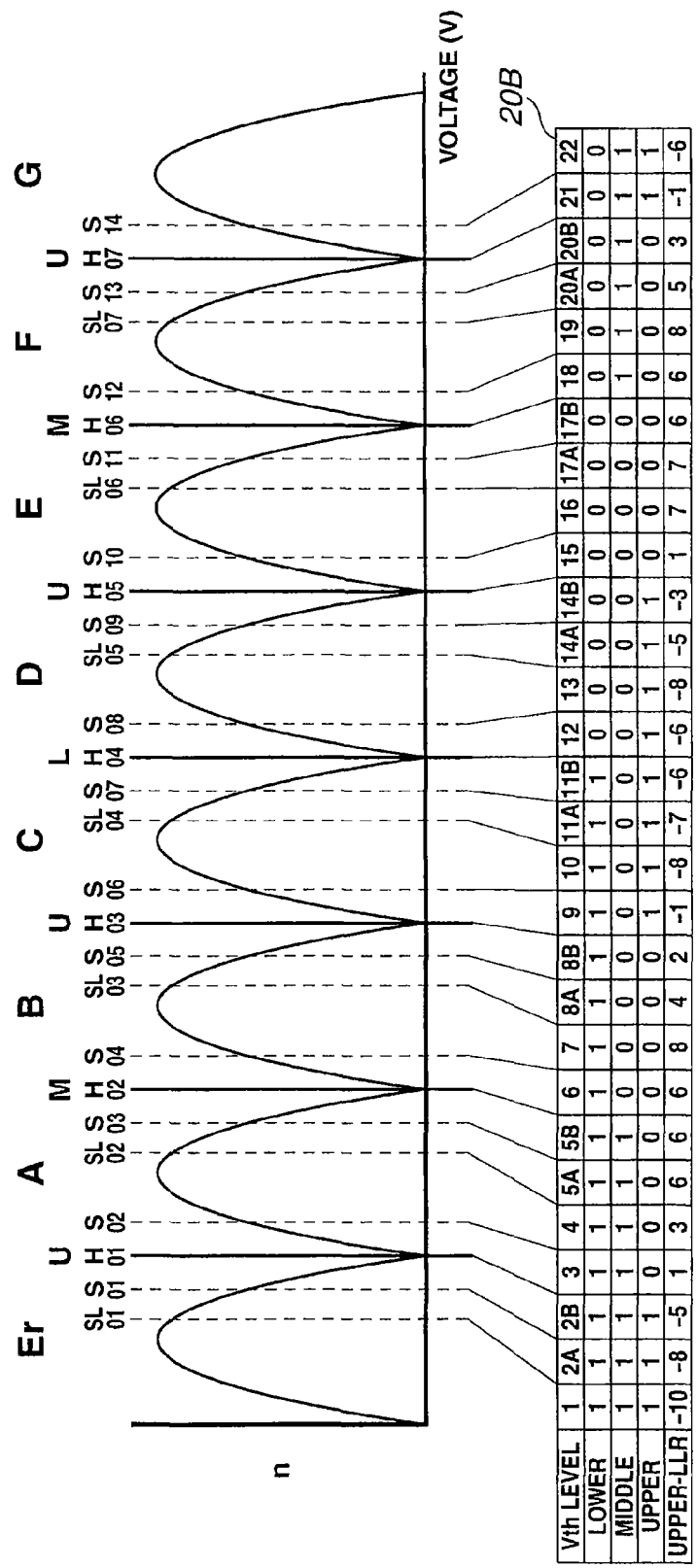
FIG. 7 is a second LLR table in decoding in the read disturb state of the memory card of the first embodiment.

In the DR mode decoding, SB2 read control for applying second soft bit read voltages SL01 to SL07 set on the low voltage side of the HB read voltages H01 to H07 to the memory cells is performed as shown in FIG. 7. The second SB read voltages SL01 to SL07 are set so that, for example, the difference from the HB read voltage is twice the SB read voltage of normal decoding. In this case, (H01-SL01)=2×(H01−S01).

<Step S21>

Second soft decision (SB2) decoding is performed based on, for example, an LLR acquired from a second LLR table 20B shown in FIG. 7 on the basis of second soft bit data (Vth level) read out by the second soft bit read voltages SL01 to SL07.

<Steps S22 and S23> (SB3 Decoding)

Figure 8:
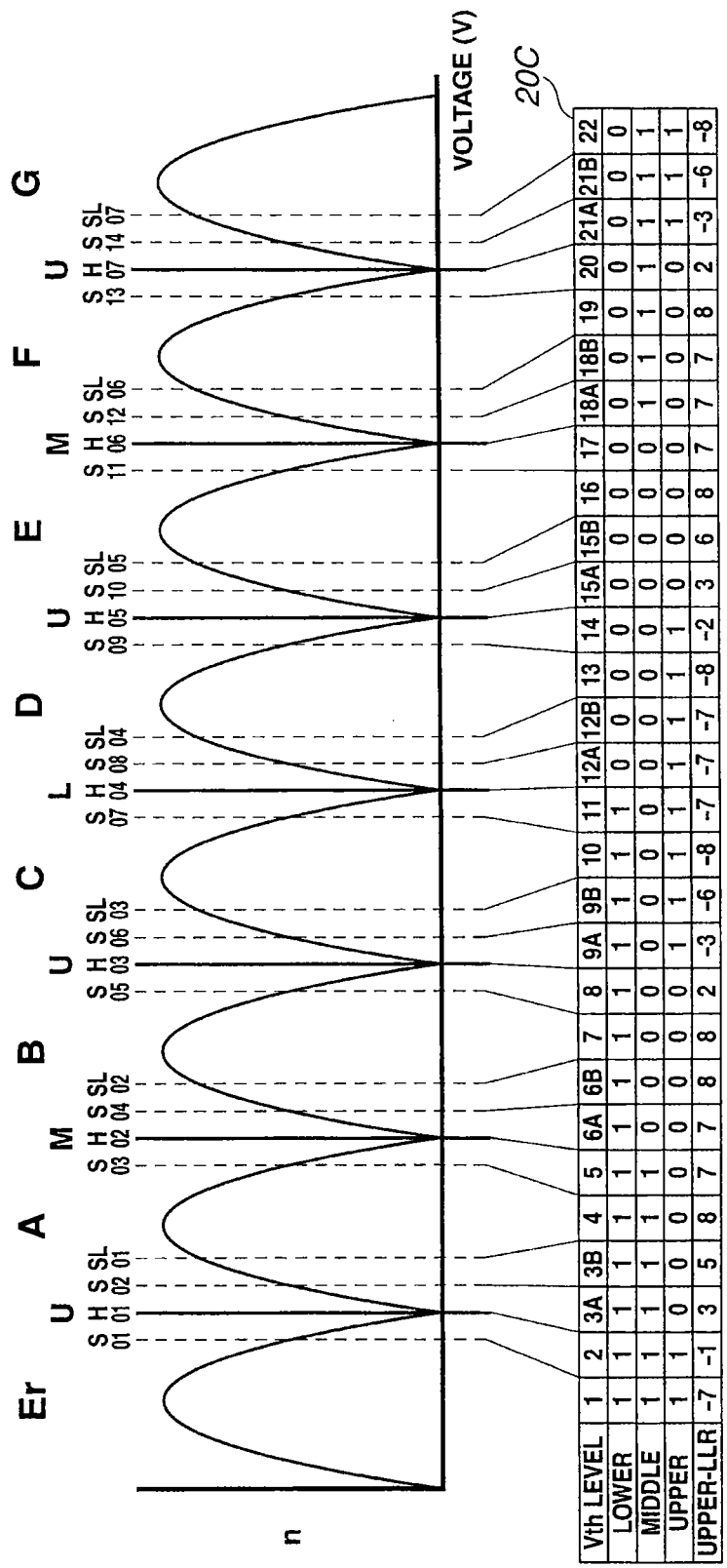
FIG. 8 is a third LLR table in decoding in the data retention state of the memory card of the first embodiment.

On the other hand, in the RD mode decoding, SB3 read control for applying third soft bit read voltages SH01 to SH07 set on the high voltage side of the HB read voltages H01 to H07 to the memory cells is performed as shown in FIG. 8. The third SB read voltages SH01 to SH07 are set so that, for example, the difference from the HB read voltages is twice the SB read voltage of normal decoding. More specifically, (SH01-H01)=2×(S02−H01).

<Step S24>

Third soft decision (SB3) decoding is performed based on, for example, an LLR acquired from a third LLR table 20C shown in FIG. 8 on the basis of third soft bit data (Vth level) read out by the third soft bit read voltages SH01 to SH07.

As described, if the soft decision decoding (SB1) based on the LLR acquired from the first LLR table 20A fails in the memory card 3, the CPU core 11 controls the ECC unit 1 to perform soft decision decoding based on the LLR acquired from the second LLR table 20B or the third LLR table 20C that are different from the first LLR table 20A, according to the positive or negative sign of a first shift value ΔV1.

More specifically, if the first shift value ΔV1 is "negative" which is smaller than "0", the CPU core 11 performs control of applying the second SB read voltages SL01 to SL07 set on the low voltage side of the HB read voltages H01 to H07 to the memory cells 13D, and the ECC unit 1 performs the second soft decision decoding based on the LLR acquired from the second LLR table 20B on the basis of the second SB data read out by the second SB read voltages. If the first shift value is "positive" which is greater than "0", the CPU core 11 performs control of applying the third SB read voltages SH01 to SH07 set on the high voltage side of the HB read voltages H01 to H07 to the memory cells 13D, and the ECC unit 1 performs the third soft decision decoding based on the LLR acquired from the third LLR table 20C on the basis of the third SB data read out by the third SB read voltages.

As a result, the soft decision decoding is performed in the memory card 3 based on the LLRs acquired from different LLR tables in accordance with a magnitude relationship between an average value of SB reread voltages after tracking and an average value of the SB read voltages before tracking. More specifically, if the SB reread voltages after tracking are the second SB read voltages SL01 to SL07, the average value of the SB reread voltages is smaller than the average value of the first SB read voltages S01 to S07, and the second LLR table 20A is used. On the other hand, if the SB reread voltages after tracking are the third SB read voltages SH01 to SH07, the average value of the SB reread voltages is greater than the average value of the first SB read voltages S01 to S07, and the third LLR table 20B is used.

More specifically, although checking the determination result of the positive or negative sign of the first shift value ΔV1 from the outside is not easy, the operation performed by the control unit can be checked by monitoring the SB read voltages or a control signal.

Although not shown, if the first shift value ΔV1 is "0", the reason that the decoding cannot be performed is not the DR or the RD. Therefore, an error signal is transmitted to the host 4 in step S27.

<Steps S25, S26, and S27>

If decoding can be performed (S25: Yes), the decoded data is transmitted to the host 4 in step S26. If decoding cannot be performed (S25: No), the error signal is transmitted to the host 4 in step S27.

As described, the memory card 3 performs the level 1 tracking with a narrow tracking range. Therefore, a processing speed of the tracking is fast. The approximation curve or the moving average is further acquired based on the histogram of the threshold voltage distribution acquired by the tracking to acquire the least frequent voltages VM. Therefore, the memory card 3 can acquire the first shift value ΔV that is less affected by the error. The read voltage set and the LLR table are further changed in the memory card 3 according to the positive or negative sign of the first shift value ΔV in the memory card 3. Therefore, decoding efficiency of the memory card 3 and a control method of the memory card 3 is excellent.

As already described, when the memory cells are managed block by block to perform tracking, it is preferable to perform subsequent soft decision decoding by a changed mode. A refresh process for copying the data stored in the block to another block may also be executed.

Each voltage of the read voltage set may be increased or decreased according to the absolute value of the first shift value ΔV. For example, in the DR mode, the HB read voltages H01 to H07 and the SB read voltages S01 to S14 can be modified to voltages obtained by subtracting the absolute value of the first shift value ΔV, and the modified read voltage set can be used to perform subsequent reading. Conversely, in the RD mode, each voltage of the read voltage set is modified to a voltage obtained by adding the absolute value of the first shift value ΔV.

Note that the read voltage set may be modified using a first shift value ΔV obtained by performing modification according to whether each read voltage is high or low. For example, in the DR mode, it is preferable to perform modification of subtracting ΔV from the HB read voltage H07 with a high voltage and to perform modification of subtracting 0.2×ΔV from the HB read voltage H01 with a low voltage.

In steps S20 and S23, not only the second SB read voltages SL01 to SL07, but also voltages including HB read voltages of a read voltage set that is reset based on the positive or negative sign of the first shift value ΔV may be applied again to reread the threshold voltage level. More specifically, the corrected HB read voltages H01 to H07 and the SB read voltages S01 to S14, in addition to at least one of the second soft bit read voltages SL01 to SL07 or SH01 to SH07, may be applied in steps S20 and S23 to read the threshold voltage level.

Modified Example of First Embodiment

A memory card 3A of a modified example of the first embodiment will be described. The memory card 3A is similar to the memory card 3. Therefore, the same constituent elements are designated with the same reference numerals, and the description will not be repeated.

In the memory card 3A, the data reading process (voltage applying process) is not executed again according to the positive or negative sign of the first shift value ΔV, and already read SB1 is used. However, the LLR table is changed.

Figure 9:
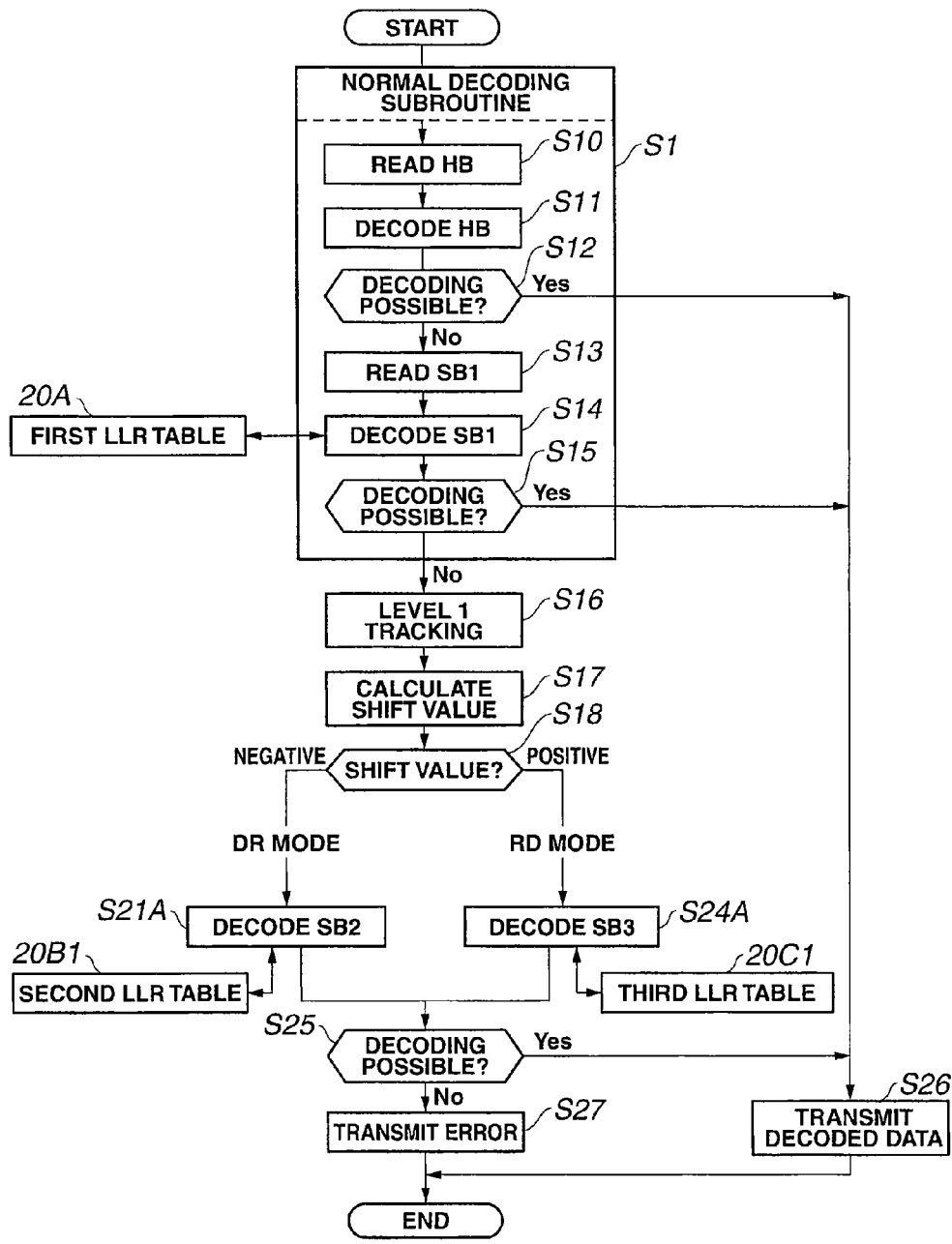
FIG. 9 is a flow chart for explaining a control method of a memory card of a modified example of the first embodiment.

As shown in FIG. 9, a flow chart of the memory card 3A is significantly similar to the flow chart of the memory card 3 shown in FIG. 3. Therefore, only different processes will be described.

<Step S21A>

Figure 10:
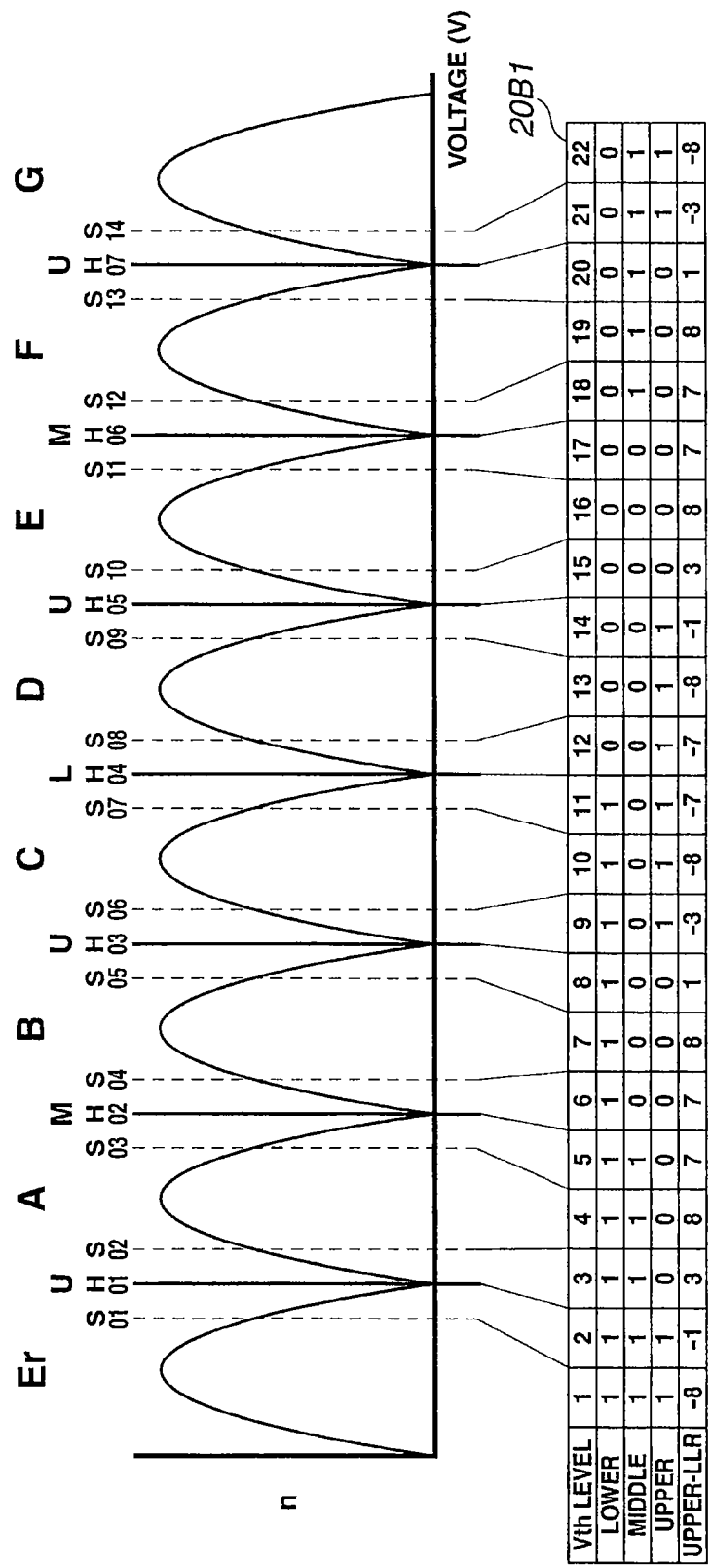
FIG. 10 is a second LLR table in decoding in the read disturb state of the memory card of the modified example of the first embodiment.

In the determination of step S19, SB2 decoding of the DR mode is performed if the first shift value ΔV is "negative". In the SB2 decoding of the memory card 3A, the rereading process is not executed by changing the read voltages. An initial LLR is acquired from a second LLR table 20B1 (see FIG. 10) different from the first LLR table 20A based on SB1 read out in the SB1 reading (S13). In the second LLR table 20B1, the degree of reliability of the threshold voltage level on the low voltage side of the HB read voltage is set lower than the degree of reliability of the threshold voltage level on the high voltage side. For example, (LLR of Vth level 14: LLR of Vth level 15) of the upper bit is (−2:2) in the LLR table 20A shown in FIG. 4, but is (−1:3) in the LLR table 20B1 shown in FIG. 10.

<Step S24A>

Figure 11:
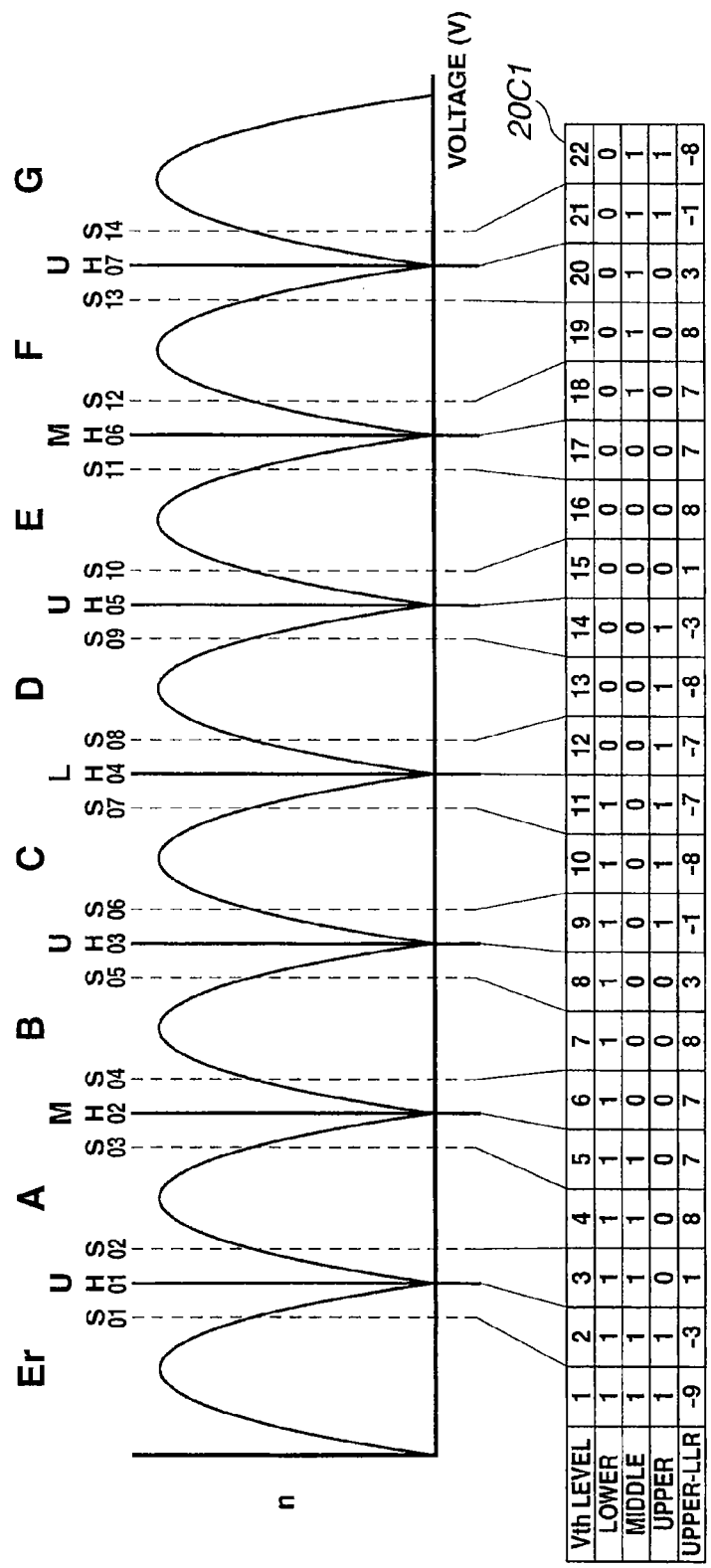
FIG. 11 is a third LLR table in decoding in the data retention state of the memory card of the modified example of the first embodiment.

On the other hand, if the shift value is "positive" in the determination of step S19, SB3 decoding of the RD mode is performed. In the SB3 decoding of the memory card 3A, the rereading process by changing the read voltages is not executed. An initial LLR is acquired from a third LLR table 20C1 (see FIG. 11) based on SB1 read out in the SB1 reading (S13). In the third LLR table 20C1, the degree of reliability of the threshold voltage level on the low voltage side of the HB read voltage is set higher than the degree of reliability of the threshold voltage level on the high voltage side. For example, (LLR of Vth level 14: LLR of Vth level 15) of the upper bit is (−2:2) in the LLR table 20A shown in FIG. 4, but is (−3:1) in the LLR table 20C1 shown in FIG. 11.

The memory card 3A and a control method of the memory card 3A have similar effects as the memory card 3 and the control method of the memory card 3, and the rereading process of data is not executed. Therefore, decoding is faster.

Second Embodiment

A memory card 3B of a second embodiment will be described. The memory card 3B is similar to the memory card 3. Therefore, the same constituent elements are designated with the same reference numerals, and the description will not be repeated.

In the memory card 3B, level 2 tracking is performed (i.e. level 1 tracking is performed twice), and which one of phenomena RD, DR, and RD/DR is occurring can be figured out. The RD/DR denotes a state in which the RD and the DR are both occurring. More specifically, the threshold voltage of the high voltage level that is easily affected by the DR is reduced, and the threshold voltage of the low voltage level that is easily affected by the RD is increased in the state.

A control method of the memory card 3B will be described with reference to a flow chart of FIG. 12.

<Steps S1 and S31>

Steps S1 and S31 are similar to those described with reference to the flow chart of FIG. 3.

<Step S32>

The same tracking as in step S16 of the flow chart of FIG. 3 is performed. More specifically, H level tracking as first tracking for measuring the first threshold voltage distribution of the first tacking range including the first hard bit read voltage H07 with the highest voltage is performed. As already described, it is preferable that the first tracking range is centered on the first hard bit read voltage.

<Step S33>

Subsequently, second tracking (L level tracking) is performed. In the L level tracking, a second threshold voltage distribution of a second tracking range centered on the second hard bit read voltage H01 with the lowest voltage among seven hard bit read voltages H01 to H07 is measured.

Note that the second tracking range and a measurement interval in the second tracking range are set according to the first tracking range.

<Step S34>

As in step S17 of the flow chart of FIG. 3, a first least frequent voltage VM1 of the first threshold voltage distribution is acquired from a result of the H level tracking. A first shift value $\Delta V1$ as a difference obtained by subtracting the first hard bit read voltage H07 from the first least frequent voltage VM1 is acquired. Note that the first shift value $\Delta V$ is especially easily changed by the DR phenomenon, and the first shift value $\Delta V$ is also called a DR shift value.

A second least frequent voltage VM2 of the second threshold voltage distribution is acquired from a result of the L level tracking. A second shift value $\Delta V2$ as a difference obtained by subtracting the second hard bit read voltage H01 from the second least frequent voltage VM2 is acquired. Note that the second shift value $\Delta V2$ is especially easily changed by the RD phenomenon, and the second shift value $\Delta V2$ is also called an RD shift value.

<Steps S35, S36, S37, S38, and S39> (SB2 decoding)

If the DR shift value $\Delta V1$ and the RD shift value $\Delta V2$ are "negative", the SB2 decoding in the DR mode as in steps S19 to S21 is performed.

<Steps S35, S40, S41, S42, and S43> (SB3 Decoding)

If the DR shift value $\Delta V1$ and the RD shift value $\Delta V2$ are "positive", the SB3 decoding in the RD mode as in steps S22 to S24 is performed.

<Steps S35, S36, S44, S45, and S46> (SB4 Decoding)

If the DR shift value $\Delta V1$ is "negative" and the RD shift value $\Delta V2$ is "positive", SB4 decoding in the DR/RD mode is performed.

Figure 13:
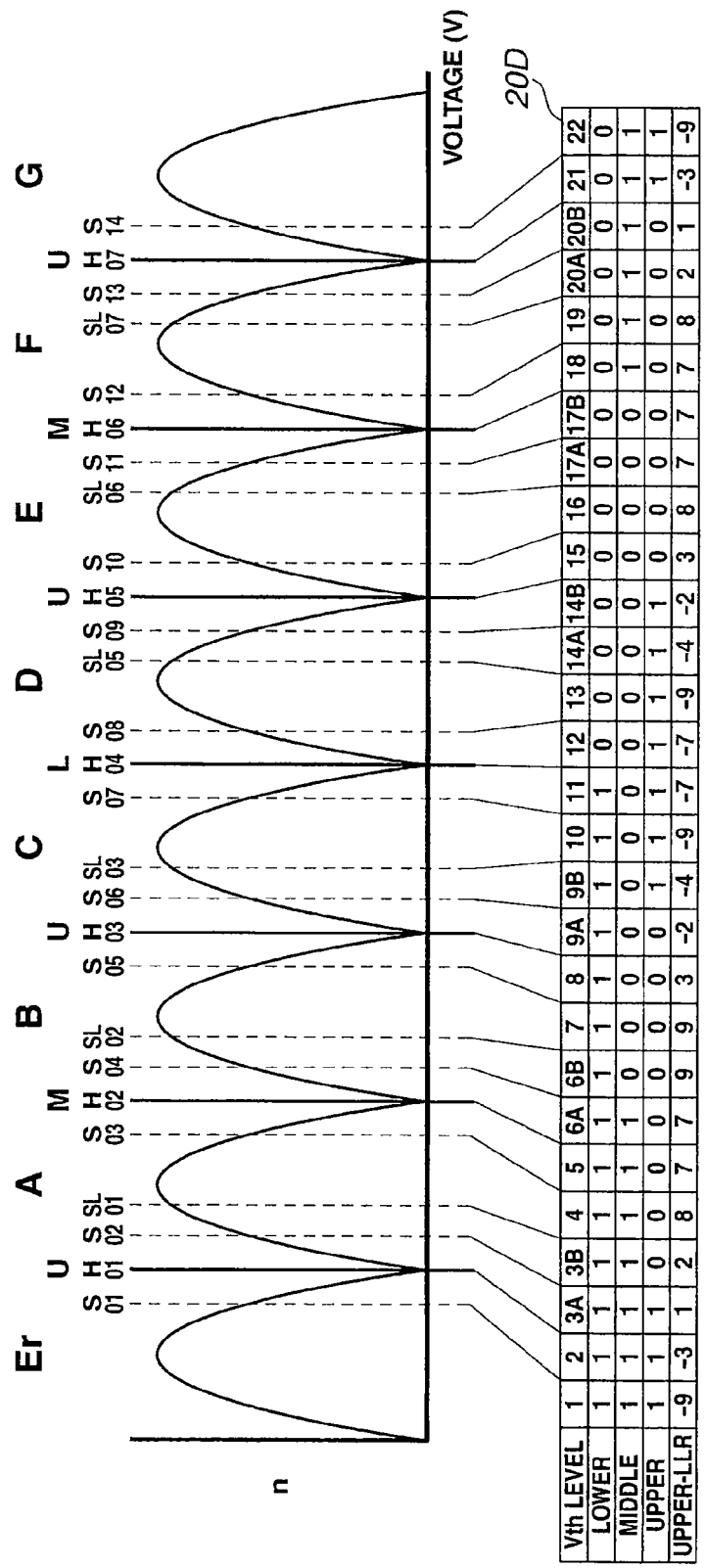
FIG. 13 is a fourth LLR table in decoding in a read disturb/data retention state of the memory card of the second embodiment.

As shown in FIG. 13, SB4 read control is performed, in which the soft bit read voltages SL05 to SL07 set on the low voltage side are applied to the memory cells for the HB read voltages H05 to H07 on the high voltage side, and the soft bit read voltages SH01 to SH03 set on the high voltage side are applied to the memory cells in the HB read voltages H01 to H03 on the low voltage side. More specifically, an SB4 read voltage set is used, in which the HB read voltages H01 to H07 are divided into the voltages H05 to H07 on the high voltage side of H04 as the median value and the voltages H01 to H03 on the low voltage side of H04, and different SB read voltage changes are performed.

Fourth soft decision (SB4) decoding is performed based on, for example, an LLR acquired from a fourth LLR table 20D for the DR/RD mode shown in FIG. 13 on the basis of fourth soft bit data (threshold voltage level) read out by the SB4 read voltage set (SH01 to SH03 and SL05 to SL07).

As shown in FIG. 13, in the fourth LLR table 20D, the degree of reliability of the threshold voltage level on the low voltage side of the HB read voltages H05 to 1107 on the high voltage side is set higher than the degree of reliability of the threshold voltage level on the high voltage side, and the degree of reliability of the threshold voltage level on the low voltage side of the HB read voltages H01 to H03 on the low voltage side is set higher than the degree of reliability of the threshold voltage level on the high voltage side.

Note that if the positive or negative sign of the DR shift value $\Delta V1$ is a positive sign (+) and the positive or negative sign of the RD shift value $\Delta V2$ is a negative sign (−) although a frequency of occurrence is significantly low, an error signal is transmitted to the host 4 in step S49.

<Steps S47, S48, and S49>

If decoding can be performed in one of the decoding modes (S47: Yes), the decoded data is transmitted to the host 4 in step S48. If decoding cannot be performed (S47: No), the error signal is transmitted to the host 4 in step S49.

The memory card 3B has the same effect as the memory card 3, and the level 2 tracking is further performed. Therefore, although the decoding time becomes long, the decoding performance is higher.

As in the memory card 3, it is preferable to perform subsequent soft decision decoding by a changed mode if the tracking is performed. Each voltage of the read voltage set may be increased or decreased according to the absolute value of the first shift value or the second shift value.

In steps S38, S42, and S45, not only the second to fourth SB read voltages, but also voltages including HB read voltages of a read voltage set that is reset based on the positive or negative sign of the shift value may be applied again to reread the threshold voltage level.

Modified Example of Second Embodiment

A memory card 3C of a modified example of the second embodiment will be described. The memory card 3C is similar to the memory card 3B. Therefore, the same constituent elements are designated with the same reference numerals, and the description will not be repeated.

In the memory card 3C, the data rereading process is not executed according to the negative or positive sign of the first shift value (DR shift value) $\Delta V1$ and the second shift value (RD shift value) $\Delta V2$, and only the LLR table is changed.

Figure 12:
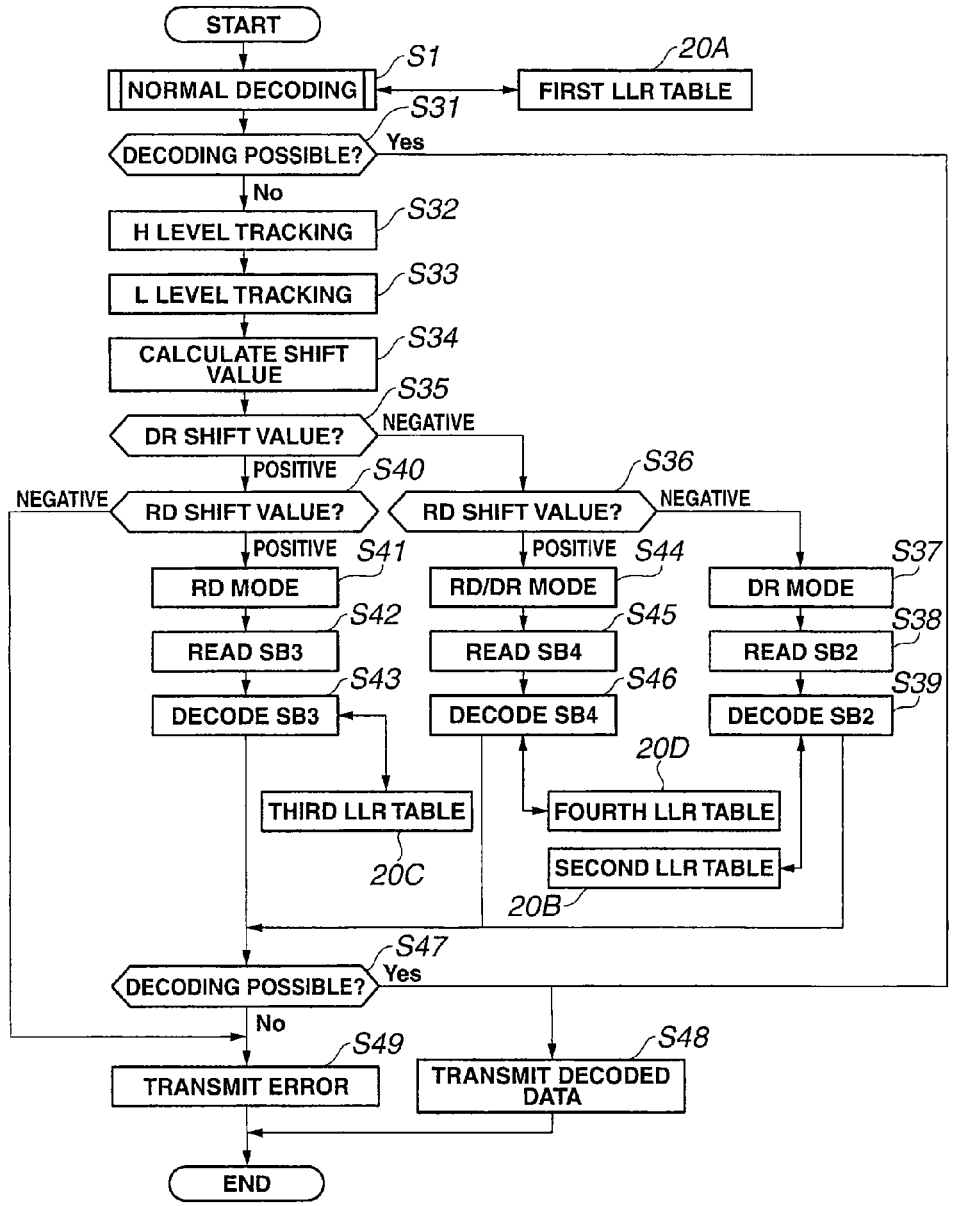
FIG. 12 is a flow chart for explaining a control method of a memory card of a second embodiment.
Figure 14:
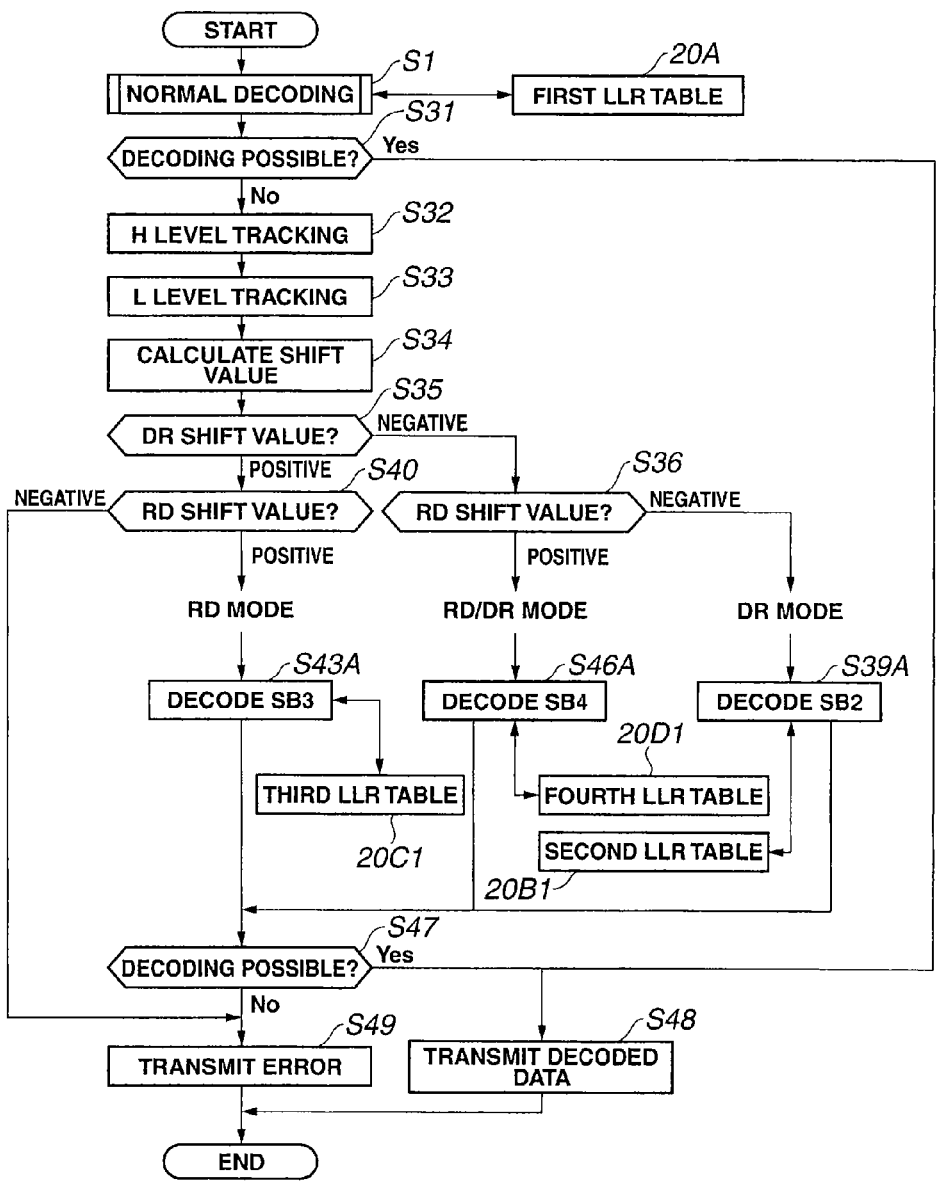
FIG. 14 is a flow chart for explaining a control method of a memory card of a modified example of the second embodiment.

As shown in FIG. 14, a flow chart of the memory card 3C is significantly similar to the flow chart of the memory card 3B shown in FIG. 12. Therefore, only different processes will be described.

<Step S39A> (SB2 Decoding)

If the DR shift value ΔV1 and the RD shift value ΔV2 are "negative", the SB2 decoding of the DR mode as in step S39 is performed. In the SB2 decoding of the memory card 3C, the rereading process by changing the read voltages is not executed. The initial LLR is acquired from the second LLR table 20B1 (see FIG. 10) different from the first LLR table 20A based on SB1 read out in the SB1 reading (S13).

<Step S43A> (SB3 Decoding)

If the DR shift value ΔV1 and the RD shift value ΔV2 are "positive", the SB3 decoding in the RD mode as in step S24 is performed. In the SB3 decoding of the memory card 3C, the rereading process by changing the read voltages is not performed. The initial LLR is acquired from the third LLR table 20C1 (see FIG. 11) different from the first LLR table 20A based on SB1 read out in the SB1 reading (S13).

<Step S46A> (SB4 Decoding)

If the DR shift value ΔV1 is "negative" and the RD shift value ΔV2 is "positive", the SB4 decoding in the DR/RD mode as in step S26 is performed. In the SB4 decoding of the memory card 3C, the rereading process by changing the read voltages is not performed. An initial LLR is acquired from a fourth LLR table 20D1 (see FIG. 15) different from the first LLR table 20A based on SB1 read out in the SB1 reading (S13).

Figure 15:
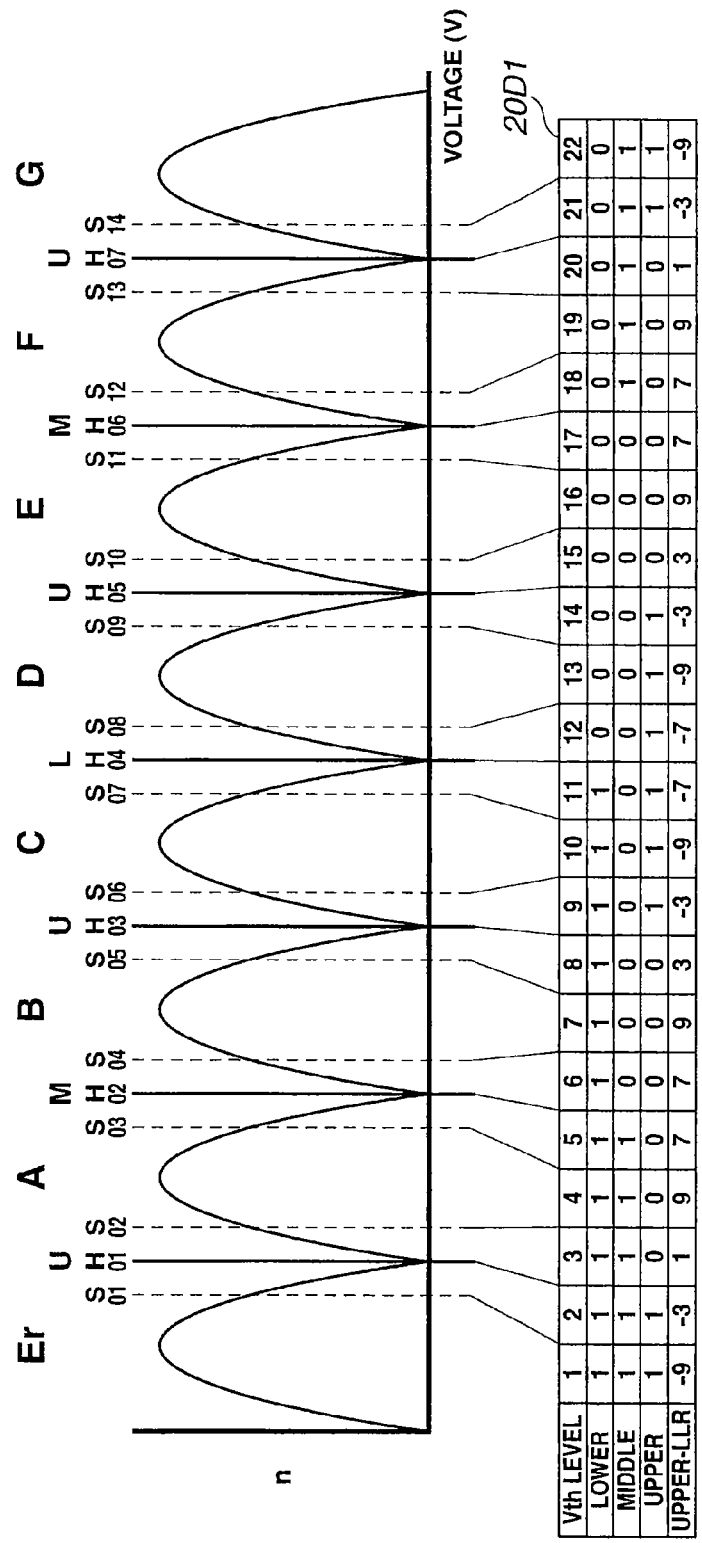
FIG. 15 is a fourth LLR table in decoding in the read disturb/data retention state of the memory card of the modified example of the second embodiment.

As shown in FIG. 15, in the fourth LLR table 20D1, the degree of reliability of the threshold voltage level on the low voltage side of the HB read voltages H05 to H07 on the high voltage side is set lower than the degree of reliability of the threshold voltage level on the high voltage side, and the degree of reliability of the threshold voltage level on the low voltage side of the HB read voltages H01 to H03 on the low voltage side is set higher than the degree of reliability of the threshold voltage level on the high voltage side.

For example, in the LLR table 20A shown in FIG. 4, (LLR of Vth level 20: LLR of Vth level 21) of the upper bit is (2:−2), and (LLR of Vth level 2: LLR of Vth level 3) is (−2:2). On the other hand, in the LLR table 20D1 shown in FIG. 15, (LLR of Vth level 20: LLR of Vth level 21) is (1:−3), and (LLR of Vth level 2: LLR of Vth level 3) is (−3:1).

The memory card 3C and the control method of the memory card 3C have the same effect as the memory card 3B and the control method of the memory card 3B, and the rereading process of the SB data is not executed. Therefore, decoding is faster.

Note that decoding is not possible if the decoding of SB2 to SB4 fails in the memory cards 3 to 3C described above. However, more detailed tracking can be further performed to perform decoding again.

For example, as shown in FIG. 16, full-level tracking A for consecutively tracking the entire range of the SB read voltages S01 to S14 may be performed to detect seven least frequent voltages. Full-level tracking B (level 7 tracking) for sequentially tracking only a range near each of the seven HB read voltages H01 to H07 may be performed to detect the least frequent voltage in each range.

If the full-level tracking is performed, seven shift values ΔV are acquired based on the difference between the least frequent voltage and the hard bit read voltage. For example, control according to the positive or negative sign of the average value of the seven shift values ΔV is performed.

Note that the embodiments for performing the soft decision decoding based on the log likelihood ratios acquired from different log likelihood ratio tables according to the positive or negative sign of the shift value that is the difference obtained by subtracting the hard bit read voltage from the least frequent voltage of the threshold distribution have been described above. However, the value that serves as a reference for selecting the log likelihood ratio table is not limited to the difference obtained by subtracting the hard bit read voltage from the least frequent voltage of the threshold distribution, as long as the value is acquired from the result of tracking of the threshold voltage distribution, and the value allows discriminating whether the memory cells are in the data retention state or in the read disturb state. For example, based on a predetermined reference voltage on the basis of the hard bit read voltage, similar effects as in the embodiments can be obtained if the soft decision decoding is performed based on log likelihood ratios acquired from different log likelihood ratio tables depending on whether the least frequent voltage of the threshold distribution is higher or lower than the hard bit read voltage. More specifically, a reference voltage obtained by adding or subtracting a predetermined voltage value from the hard bit read voltage may be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
   a plurality of memory cells, each memory cell storing data of N bits (N is a natural number no less than 2);
   a control unit configured to perform control of applying voltages of a read voltage set including ($2^N-1$) hard bit read voltages and a plurality of soft bit read voltages to each of the memory cells; and
   an error correction unit configured to acquire a log likelihood ratio from a log likelihood ratio table on the basis of soft bit data read out by the soft bit read voltages, the error correction unit configured to perform soft decision decoding based on the acquired log likelihood ratio, wherein
   the control unit performs first tracking for measuring a first threshold voltage distribution of a first tracking range including a predetermined first hard bit read voltage among the plurality of hard bit read voltages, and
   the error correction unit performs the soft decision decoding based on log likelihood ratios acquired from different log likelihood ratio tables depending on whether a first least frequent voltage acquired from the first threshold voltage distribution is higher or lower than a predetermined reference voltage on the basis of the first hard bit read voltage.

2. The memory device according to claim 1, wherein
   the error correction unit performs the soft decision decoding based on log likelihood ratios acquired from different log likelihood ratio tables according to a positive or negative sign of a first shift value based on a difference between the first least frequent voltage and the first hard bit read voltage.

3. The memory device according to claim 2, wherein
   the first hard bit read voltage is a hard bit read voltage with a highest voltage, and the first tracking range is centered on the first hard bit read voltage.

4. The memory device according to claim 3, wherein the first tracking range is no greater than $1/(2^N-1)$ of a difference between a second hard bit read voltage with a lowest voltage among the plurality of hard bit read voltages and the first hard bit read voltage.

5. The memory device according to claim 4, wherein intervals of voltages for measuring the threshold voltage distribution are no less than $1/100$ and no greater than $1/4$ of intervals of the hard bit read voltages.

6. The memory device according to claim 5, wherein the control unit acquires the first least frequent voltage from an approximation curve or a moving average based on a histogram of the first threshold voltage distribution acquired by the first tracking.

7. The memory device according to claim 6, wherein the control unit increases and decreases voltages of the read voltage set according to a positive or negative sign and an absolute value of the first shift value.

8. The memory device according to claim 7, wherein the control unit performs the first tracking if the number of failures of the soft decision decoding based on a log likelihood ratio acquired from a first log likelihood ratio table exceeds a predetermined threshold.

9. The memory device according to claim 2, wherein if the first shift value is negative,
   the control unit performs control of applying a second soft bit read voltage that is set on a low voltage side of each of the hard bit read voltages to the memory cells, and
   the error correction unit performs the soft decision decoding based on a log likelihood ratio acquired from a second log likelihood ratio table on the basis of second soft bit data read out by the second soft bit read voltage, and
if the first shift value is positive,
   the control unit performs control of applying a third soft bit read voltage that is set on a high voltage side of each of the hard bit read voltages to the memory cells, and
   the error correction unit performs the soft decision decoding based on a log likelihood ratio acquired from a third log likelihood ratio table on the basis of third soft bit data read out by the third soft bit read voltage.

10. The memory device according to claim 9, wherein the first hard bit read voltage is a hard bit read voltage with a highest voltage, and
the first tracking range is centered on the first hard bit read voltage.

11. The memory device according to claim 10, wherein the first tracking range is no greater than $1/(2^N-1)$ of a difference between a second hard bit read voltage with a lowest voltage among the plurality of hard bit read voltages and the first hard bit read voltage.

12. The memory device according to claim 11, wherein intervals of voltages for measuring the threshold voltage distribution are no less than $1/100$ and no greater than $1/4$ of intervals of the hard bit read voltages.

13. The memory device according to claim 12, wherein the control unit acquires the first least frequent voltage from an approximation curve or a moving average based on a histogram of the first threshold voltage distribution acquired by the first tracking.

14. The memory device according to claim 13, wherein the control unit increases and decreases voltages of the read voltage set according to a positive or negative sign and an absolute value of the first shift value.

15. The memory device according to claim 14, wherein the control unit performs the first tracking if the number of failures of the soft decision decoding based on a log likelihood ratio acquired from a first log likelihood ratio table exceeds a predetermined threshold.

16. The memory device according to claim 2, wherein the control unit performs second tracking for measuring a second threshold voltage distribution of a second tracking range including a predetermined second hard bit read voltage among the plurality of hard bit read voltages,
if the first shift value and a second shift value based on a difference between a second least frequent voltage acquired from the second threshold voltage distribution and the second hard bit read voltage are negative,
   the control unit performs control of applying a second soft bit read voltage that is set on a low voltage side of each of the hard bit read voltages to the memory cells, and
   the error correction unit performs the soft decision decoding based on a log likelihood ratio acquired from a second log likelihood ratio table on the basis of second soft bit data read out by the second soft bit read voltage,
if the first shift value and second shift value are positive,
   the control unit performs control of applying a third soft bit read voltage that is set on a high voltage side of each of the hard bit read voltages to the memory cells, and
   the error correction unit performs the soft decision decoding based on a log likelihood ratio acquired from a third log likelihood ratio table based on third soft bit data read out by the third soft bit read voltage, and
if the first shift value is negative and the second shift value is positive
   the control unit performs control of applying a soft bit read voltage that is set on the low voltage side of each of the hard bit read voltages to the memory cells for the hard bit read voltages on the high voltage side and applying a fourth soft bit read voltage including a soft bit read voltage that is set on the high voltage side of each of the hard bit read voltages to the memory cells for the hard bit read voltages on the low voltage side, and
   the error correction unit performs the soft decision decoding based on a log likelihood ratio acquired from a fourth log likelihood ratio table on the basis of fourth soft bit data read out by the fourth soft bit read voltage.

17. The memory device according to claim 16, wherein the first hard bit read voltage is a hard bit read voltage with a highest voltage,
the second hard bit read voltage is a hard bit read voltage with a lowest voltage,
the first tracking range is centered on the first hard bit read voltage, and
the second tracking range is centered on the second hard bit read voltage.

18. The memory device according to claim 17, wherein the first tracking range and the second tracking range are no greater than $1/(2^N-1)$ of ranges of the second hard bit read voltage and the first hard bit read voltage.

19. The memory device according to claim 18, wherein
the control unit acquires the first least frequent voltage from an approximation curve or a moving average based on a histogram of the first threshold voltage distribution acquired by the first tracking and acquires the second least frequent voltage from an approximation curve or a moving average based on a histogram of the second threshold voltage distribution acquired by the second tracking.

20. A method of controlling a memory device,
the memory device comprising:
   a plurality of memory cells, each memory cell storing data of N bits (N is a natural number no less than 2);
   a control unit configured to perform control of applying voltages of a read voltage set including ($2^N-1$) hard bit read voltages for reading a hard bit data and a plurality of soft bit read voltages for reading a threshold voltage including degree-of-reliability information of the hard bit data to each of the memory cells; and
   an error correction unit configured to perform soft decision decoding based on a log likelihood ratio acquired from a log likelihood ratio table on the basis of the threshold voltage, the method comprising:
   measuring a first threshold voltage distribution of a predetermined range centered on a first hard bit read voltage with a highest voltage among the plurality of hard bit read voltages;
   calculating a first shift value based on a difference between a first least frequent voltage acquired from the first threshold voltage distribution and the first hard bit read voltage;
   performing, if the first shift value is negative, control of applying a second soft bit read voltage that is set on a low voltage side of each of the hard bit read voltages to the memory cells, and performing, if the first shift value is positive, control of applying a third soft bit read voltage that is set on a high voltage side of each of the hard bit read voltages to the memory cells; and
   performing the soft decision decoding based on a log likelihood ratio acquired from a second log likelihood ratio table or a third log likelihood ratio table on the basis of a threshold voltage read out by the second soft bit read voltage or the third soft bit read voltage, by the error correction unit.

* * * * *

UNITED STATES PATENT AND TRADEMARK OFFICE
CERTIFICATE OF CORRECTION

Page 1 of 1

PATENT NO. : 8,625,347 B2
APPLICATION NO. : 13/597444
DATED : January 7, 2014
INVENTOR(S) : Kenji Sakurada It is certified that error appears in the above-identified patent and that said Letters Patent is hereby corrected as shown below:

On the title page, Item (30), the 2$^{nd}$ Foreign Application Priority Data Information has been omitted. Item (30) should read:

--(30)      Foreign Application Priority Data

Sep. 22, 2011   (JP)            2011-207701
    Mar. 29, 2012   (JP)            2012-076747--

Signed and Sealed this
Fifteenth Day of April, 2014

Michelle K. Lee
*Deputy Director of the United States Patent and Trademark Office*